(12) United States Patent
Truhitte

(10) Patent No.: US 9,659,876 B1
(45) Date of Patent: May 23, 2017

(54) WAFER-SCALE MARKING SYSTEMS AND RELATED METHODS

(71) Applicant: SEMICONDUCTOR COMPONENTS INDUSTRIES, LLC, Phoenix, AZ (US)

(72) Inventor: Darrell D. Truhitte, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/203,599

(22) Filed: Jul. 6, 2016

(51) Int. Cl.
*H01L 21/302* (2006.01)
*H01L 23/544* (2006.01)

(52) U.S. Cl.
CPC .... *H01L 23/544* (2013.01); *H01L 2223/5446* (2013.01); *H01L 2223/5448* (2013.01); *H01L 2223/54406* (2013.01); *H01L 2223/54433* (2013.01)

(58) Field of Classification Search
None
See application file for complete search history.

(56) References Cited

U.S. PATENT DOCUMENTS

| | | | | |
|---|---|---|---|---|
| 4,661,203 A | * | 4/1987 | Smith | G03F 7/42 156/345.39 |
| 5,733,711 A | * | 3/1998 | Juengling | G03F 7/00 430/22 |
| 2009/0130570 A1 | * | 5/2009 | Zhang | G03F 7/70466 430/5 |

OTHER PUBLICATIONS

Tianhong Cui, "Dry Etching", Dec. 14, 2011, Publisher: http://wcam.engr.wisc.edu/Public/Reference/PlasmaEtch/Introduction%20to%20Dry%20Etching.pdf.
Semi-sace.org, "Introduction to Plasma Etching", Feb. 3, 2013, Publisher: http://www.semi-sace.org/fileadmin/user_upload/documents/KJ_Etching_intro-SACE201302.pdf.
Theodore H. Fedynyshyn, Gregory W. Grynkewich, Bomy A. Chen, T.P. Ma, "Abstract of the Effect of Metal Masks on the Plasma Etch Rate of Silicon", "Journal of the Electrochemical Society", Dec. 31, 1989, p. 1799 vol. 136, No. 6, Publisher: http://jes.ecsdl.org/content/136/6/1799.abstract.

* cited by examiner

*Primary Examiner* — Angel Roman
(74) *Attorney, Agent, or Firm* — Adam R. Stephenson, Ltd.

(57) ABSTRACT

A method of wafer-scale marking includes coupling a first marking mask over a semiconductor wafer having unsingulated semiconductor devices thereon. The first marking mask has a plurality of first stencils therethrough and a surface of the wafer is plasma etched through the first stencils to form first markings in the surface. A second marking mask is coupled over the surface and includes a plurality of second stencils therethrough. The surface is plasma etched through the second stencils to form second markings in the surface. In implementations the first marking mask and second marking mask are simultaneously coupled over the surface and the first markings and second markings are simultaneously formed. In implementations a plurality of first windows of the first marking mask are aligned with the plurality of second stencils while a plurality of second windows of the second marking mask are aligned with the plurality of first stencils.

20 Claims, 7 Drawing Sheets

WAFER-SCALE MARKING SYSTEMS AND RELATED METHODS

BACKGROUND

1. Technical Field

Aspects of this document relate generally to semiconductor device marking methods and systems.

2. Background

Some semiconductor devices, before or after singulation, are marked with one or more codes or other indicators to identify a manufacturer, device type, lot number, or part number. Conventional device marking systems include laser based marking systems.

SUMMARY

Implementations of methods of wafer-scale marking may include: providing a semiconductor wafer including a plurality of unsingulated semiconductor devices, the semiconductor wafer having a surface; coupling a first marking mask over the surface, the first marking mask having a plurality of first stencils therethrough; plasma etching the surface through the plurality of first stencils to form a plurality of first markings in the surface; coupling a second marking mask over the surface, the second marking mask having a plurality of second stencils therethrough, and; plasma etching the surface through the plurality of second stencils to form a plurality of second markings in the surface.

Implementations of methods of wafer-scale marking may include one, all, or any of the following:

Simultaneously coupling the first marking mask and the second marking mask over the surface.

Simultaneously forming each of the plurality of first markings.

Simultaneously forming each of the plurality of second markings while simultaneously forming each of the plurality of first markings.

Simultaneously forming each of the plurality of second markings.

Aligning a plurality of first windows of the first marking mask with the plurality of second stencils while simultaneously aligning a plurality of second windows of the second marking mask with the plurality of first stencils.

Plasma etching a plurality of scribe lines in the surface through a plurality of scribe line stencils in the first marking mask, the second marking mask, and/or a third marking mask.

Each of the plurality of first markings may include a semiconductor device identifier and/or a date indicator.

Each of the plurality of second markings may include a semiconductor device identifier and/or a date indicator.

The plurality of first markings and/or the plurality of second markings may include alphanumeric characters.

Implementations of methods of wafer-scale marking may include: providing a semiconductor wafer including a plurality of unsingulated semiconductor devices, the semiconductor wafer having a surface; coupling a first marking mask over the surface, the first marking mask having a plurality of first stencils therethrough and having a plurality of first windows therethrough; coupling a second marking mask over the surface so that a plurality of second stencils of the second marking mask align with the plurality of first windows and so that a plurality of second windows of the second marking mask align with the plurality of first stencils, the plurality of second stencils and the plurality of second windows extending through the second marking mask; forming a plurality of first markings on the surface by plasma etching the surface through the plurality of second windows and through the plurality of first stencils, and; while forming the plurality of first markings, simultaneously forming a plurality of second markings on the surface by plasma etching the surface through the plurality of first windows and through the plurality of second stencils.

Implementations of methods of wafer-scale marking may include one, all, or any of the following:

The plurality of first windows may be aligned in rows and columns that align with rows and columns of the plurality of second stencils.

The plurality of second windows may be aligned in rows and columns that align with rows and columns of the plurality of first stencils.

Plasma etching a plurality of scribe lines in the surface through a plurality of scribe line stencils in the first marking mask, the second marking mask, and/or a third marking mask.

Each of the plurality of first markings and each of the plurality of second markings may include a semiconductor device identifier and/or a date indicator, and the plurality of first markings and/or the plurality of second markings may include alphanumeric characters.

Implementations of wafer-scale marking systems (systems) may include: a holder configured to receive a semiconductor wafer; a first marking mask configured to couple with the holder over the semiconductor wafer, the first marking mask having a plurality of first stencils therethrough and a plurality of first windows therethrough, the plurality of first stencils aligned in rows and columns and the plurality of first windows aligned in rows and columns, and; a second marking mask configured to couple with the holder over the first marking mask, the second marking mask having a plurality of second stencils therethrough and a plurality of second windows therethrough, the plurality of second stencils aligned in rows and columns and the plurality of second windows aligned in rows and columns; wherein the plurality of first stencils align with the plurality of second windows and wherein the plurality of second stencils align with the plurality of first windows.

Implementations of wafer-scale marking systems (systems) may include one, all, or any of the following:

The system may be configured to allow plasma etching of a surface of the semiconductor wafer through the plurality of first stencils and the plurality of second windows to form a plurality of first markings while simultaneously allowing plasma etching of the surface through the plurality of second stencils and the plurality of first windows to form a plurality of second markings.

Each of the plurality of first stencils and each of the plurality of second stencils may include a semiconductor device identifier and/or a date indicator, and the plurality of first stencils and/or the plurality of second stencils may include alphanumeric characters.

The columns of the plurality of first stencils, the columns of the plurality of first windows, the columns of the plurality of second stencils, and the columns of the plurality of second windows may be aligned, the rows of the plurality of first stencils and the rows of the plurality of first windows may be offset, and the rows of the plurality of second stencils and the rows of the plurality of second windows may be offset.

The rows of the plurality of first stencils and the rows of the plurality of second windows may be aligned, and the rows of the plurality of second stencils and the rows of the plurality of first windows may be aligned.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended wafer-scale marking systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such wafer-scale marking systems and related methods, and implementing components and methods, consistent with the intended operation and methods.

Figure 4:
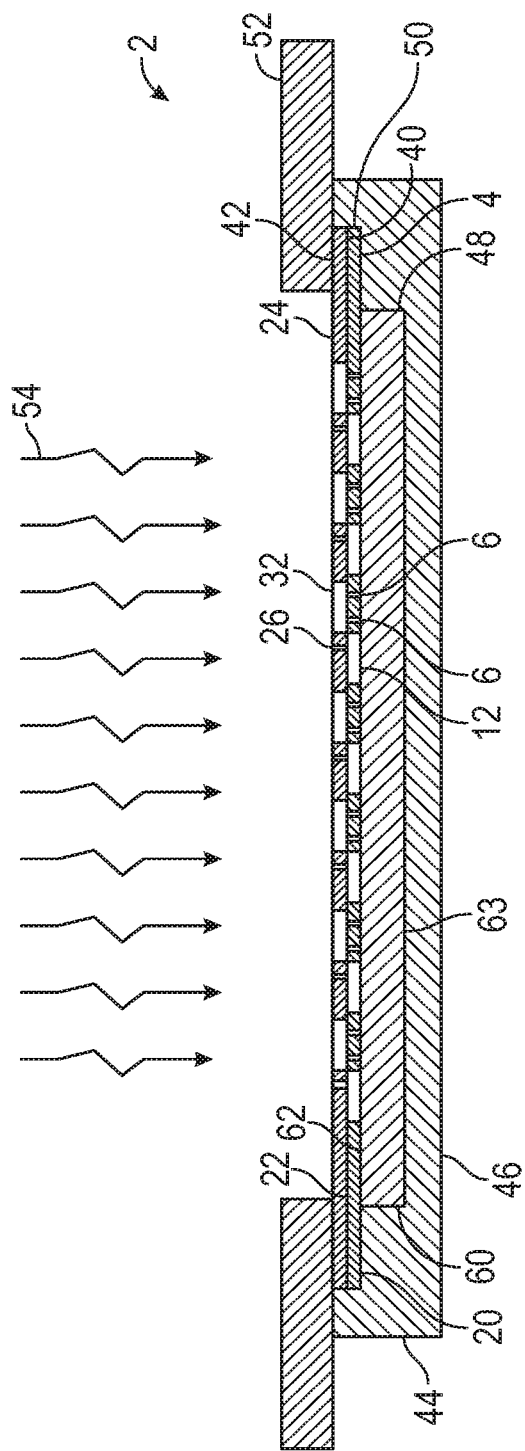
FIG. 4 is a side cross-section view of an implementation of a wafer-scale marking system (system)

Referring now to FIG. 4, a cross-section of an implementation of a wafer-scale marking system (system) 2 is shown. The system includes a holder 44 which receives a semiconductor wafer (wafer) 60. The wafer could, for example, be a silicon (Si) wafer, though in other implementations it could be formed of other semiconducting materials such as gallium arsenide (GaAs), germanium (Ge), organic semiconductors, and so forth. In the implementations illustrated in the drawings the wafer is a silicon wafer.

The wafer includes a plurality of unsingulated semiconductor devices and has a first surface 62. Any type of semiconductor devices could be included in or on the semiconductor wafer (and may extend any distance through the thickness of the wafer between first surface 62 and a second surface 63 opposite the first surface 62). In the implementations shown the devices are flip chip and/or chip-scale package (CSP) devices that have electrical contacts on the second surface. A first marking mask 4 and second marking mask 24 are coupled over the first surface of the wafer, and each marking mask includes a plurality of stencils and windows, as will be explained hereafter. Plasma 54 is used to etch markings in the first surface of the wafer through the stencils and windows. In implementations the system is used in this manner to form one or more markings on each unsingulated device, so that later when the wafer is singulated each singulated device will have the one or more markings thereon. In implementations the system may also be used to form scribe lines in the first surface of the wafer to assist with singulation. In some implementations, where the wafer contains wafer-scale packaged semiconductor devices, the system may be used to mark these devices prior to singulation. In such implementations, the marking may take place on a surface of a wafer, or on a material like a mold compound or substrate which is part of the wafer-scale package system.

Figure 1:
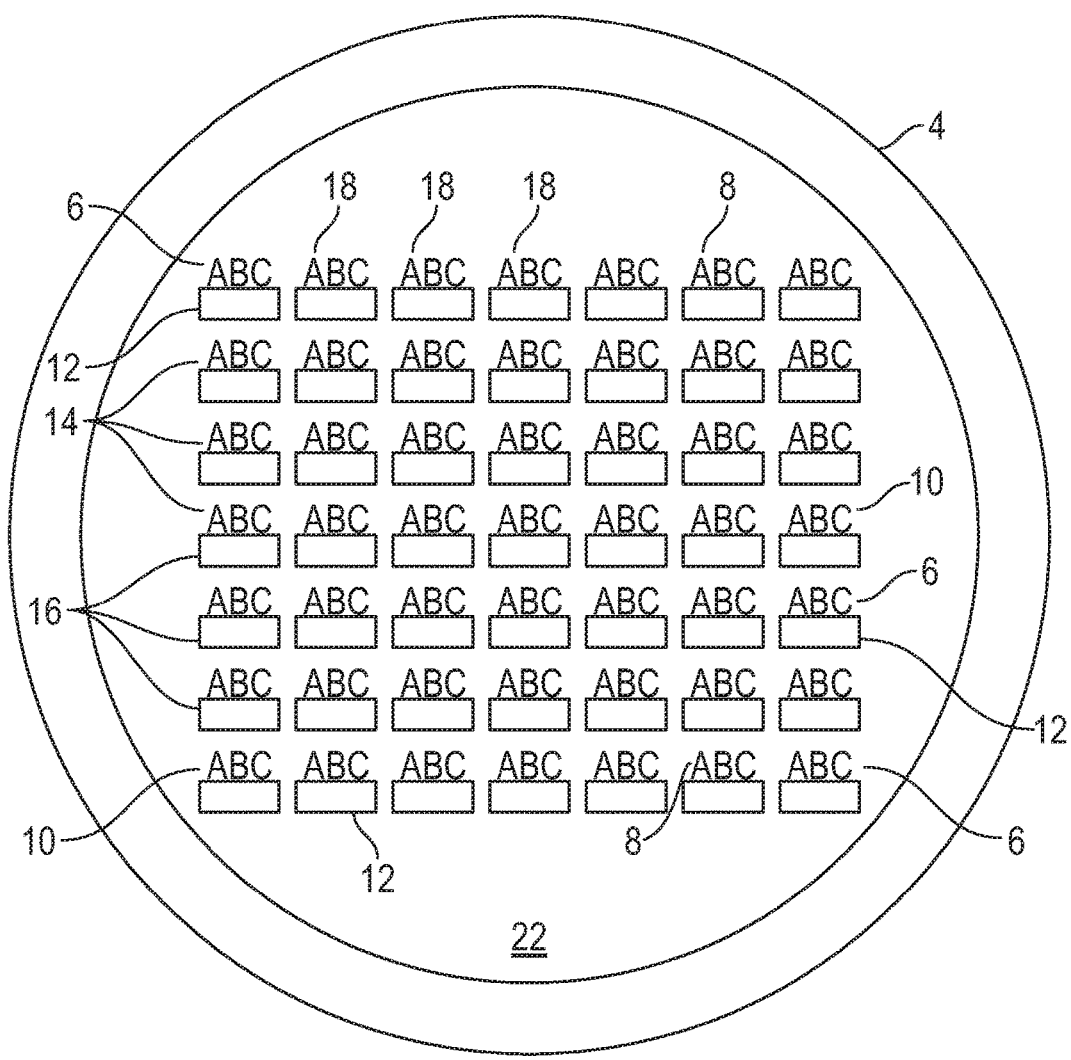
FIG. 1 is a top view of an implementation of first marking mask of an implementation of a wafer-scale marking system (system) shown in FIG. 4.

Referring now to FIGS. 1 and 4, a representative example of a first marking mask 4 is shown. The first marking mask has a first surface 20 and a second surface 22 opposite the first surface 20. A plurality of first stencils 6 extend through the first marking mask all the way from the first surface 20 to the second surface 22. The first stencils could take on any form, such as alphanumeric characters 8 as representatively shown in FIG. 1 or, in other implementations, non-alphanumeric symbols or some other characters formatted on the stencil in such a way to ensure that closed areas of the symbols are exactly or approximately represented. In the representative example shown in FIG. 1 the first stencils are semiconductor device identifiers (device codes) 10. They may accordingly be used to create first markings which identify the type or model of semiconductor device. By non-limiting example, they could identify a manufacturer's specific model of semiconductor device such as by identifying an integrated circuit model that includes any combination and number of elements including diodes, transistors, sensors, controllers, memory elements, and so forth.

Although the first stencils are disclosed in the representative example as being device codes, in other implementations they could include other codes or indicators such as, by non-limiting example: manufacturing date codes or indicators, lot or batch number indicators, fabrication site indicators, and so forth.

FIG. 1 shows that the first stencils are organized into rows 14 and columns 18. In the representative example there are seven rows and seven columns of first stencils, so that there are forty-nine total first stencils, and thus in the representative example the first marking mask could be utilized to mark forty-nine unsingulated semiconductor devices of the wafer prior to singulation. In other implementations there could be more or less rows and/or more or less columns of first stencils, such as to accommodate a greater or smaller number of devices.

In fact, in practice it is expected that many more than forty-nine unsingulated semiconductor devices will be included in or on the semiconductor wafer—one or more orders of magnitude more—so that the relative size of each semiconductor device (and each first stencil and first window, accordingly) is greatly exaggerated in the drawings, only for ease of illustration. In actual time estimates used to determine the amount of time to mark wafers using conventional marking processes, such as with laser marking, calculations were done assuming that each wafer was a six-inch wafer having 2,200 to 11,500 semiconductor devices therein/thereon. An eight-inch wafer may have nearly twice the surface area of a six-inch wafer, and thus it is expected that in some cases an eight-inch wafer could have over 20,000 semiconductor devices thereon. In such a case, therefore, there could be about 140 rows and 140 columns of first stencils (and the same number of rows/columns of first windows) on the first marking mask to accomplish marking of the entire array of 20,000 or more semiconductor devices using the first marking mask. The number of rows and columns of first stencils could further be scaled upwards, or downwards, as desired, in order to accommodate marking of any number of semiconductor devices per wafer.

The first stencils in the representative example are seen to have a three letter code, "ABC." This is used only as a representative example. In other implementations the first stencil could include more letters, less letters, no letters, one or more numbers, one or more symbols, and so forth, and if alphanumeric characters are used any known or past or hereafter invented alphabets or number systems or combination thereof could be used. Each first stencil is seen to have only one row of characters, though in other implementations the first stencil could be formed of two or more rows of characters.

The first marking mask is seen in FIG. 1 to have a number of first windows 12. Each first window in the representative example is located just below one of the first stencils and is seen to have an area such that the entire first stencil would be able to fit within the first window. Each first window is an opening that extends all the way from the first surface 20 to the second surface 22 of the first marking mask. In the representative example each first window has a shape of a rectangle, though in other implementations it could have the shape of a square, a circular or oval shape, a rounded rectangle, a stadium shape, and any other regular or irregular shape. The shape of a rectangle may make it convenient for allowing a stencil to fit neatly within its outline.

The first windows are arranged in rows 16 and columns 18. The columns of the first windows thus align with the columns of the first stencils, while the rows of the first windows are offset from the rows of the first stencils (in other words shifted below the rows of first stencils, as FIG. 1 reveals). In other implementations the relative arrangement could be different—for example the first windows could be shifted above the first stencils instead of shifted below the first stencils. Or, in other implementations, the rows of the first stencils and first windows could be aligned while their columns are misaligned—so that the first window columns are shifted to the right or to the left of the first stencil columns. Other configurations are possible. In any implementation in which the relative arrangement of first windows and first stencils is altered, corresponding alterations may also be made to a second marking mask (which second marking mask will be described further below) as will be understood by the practitioner of ordinary skill in the art to form a desirable configuration for a wafer-scale marking system.

Figure 2:
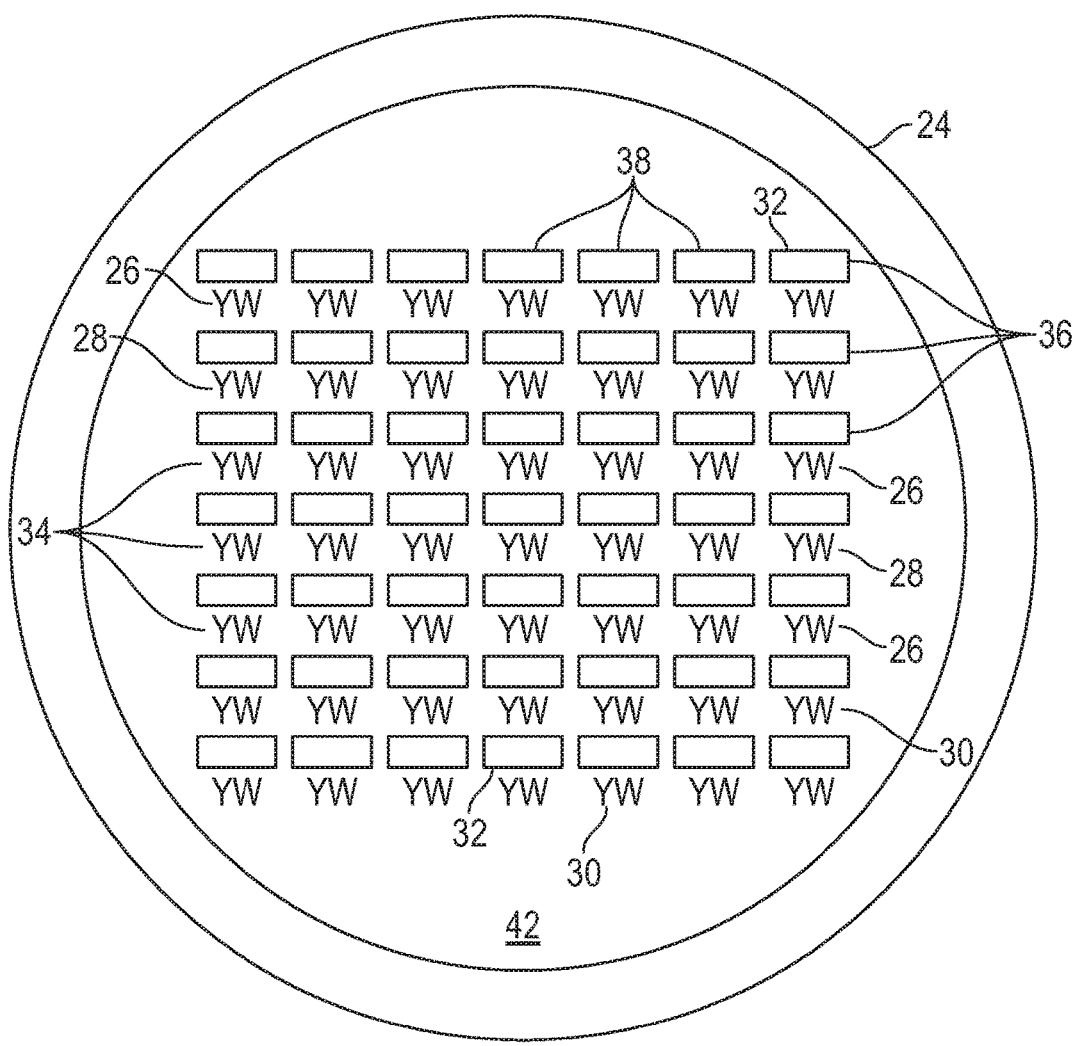
FIG. 2 is a top view of an implementation of a second marking mask of the system of FIG. 4.

Referring now to FIGS. 2 and 4, a representative example of a second marking mask 24 is shown. The second marking mask has a first surface 40 and a second surface 42 opposite first surface 40. A plurality of second stencils 26 extend through the second marking mask all the way from the first surface 40 to the second surface 42. The second stencils could take on any form, such as alphanumeric characters 28 as representatively shown in FIG. 2 or, in other implementations, non-alphanumeric symbols or some other characters, similarly as described above for the first stencils. In the representative example shown in FIG. 2 the second stencils are date indicators (date codes) 30. They are, accordingly, used to create second markings which identify the manufacturing date of the semiconductor devices. By non-limiting example, they could identify one or more of a year, a month, and/or a day of manufacture, and so forth. In other implementations the second stencils include both a date code and a traceability marking, such as a code or indicator of the fabrication location or plant where the device was fabricated and/or a lot traceability indicator. In some implementations a first marking mask could be used for the device code and the date and plant or lot traceability codes could be implemented using either one or two other marking masks.

Although the second stencils are disclosed in the representative example as being date codes (and/or lot/batch/plant traceability codes), in other implementations they could include other codes or indicators such as, by non-limiting example: device codes or semiconductor device identifiers (as described above with respect to the first stencils), fabrication site indicators, and so forth.

FIG. 2 shows that the second stencils are organized into rows 34 and columns 38. In the representative example there are seven rows and seven columns of second stencils, so that there are forty-nine total second stencils, and thus in the representative example the second marking mask could be utilized to mark forty-nine unsingulated semiconductor devices of the wafer prior to singulation. In other implementations there could be more or less rows and/or more or less columns of second stencils, such as to accommodate a greater number (including several orders of magnitude greater) or a smaller number of devices, similarly as described above for the first marking mask.

The second stencils in the representative example are seen to have a two letter code, "YW." This is used only as a representative example. In other implementations the second stencil could include more letters, less letters, no letters, one or more numbers, one or more symbols, and so forth. Each second stencil is seen to have only one row of characters, though in other implementations the second stencil could be formed of two or more rows of characters.

The second marking mask is seen in FIG. 2 to have a number of second windows 32. Each second window in the representative example is located just above one of the second stencils and is seen to have an area such that the entire second stencil would be able to fit within the second window. Each second window is an opening that extends all the way from the first surface 40 to the second surface 42 of the second marking mask. In the representative example each second window has a shape of a rectangle, though in other implementations it could have the shape of a square, a circular or oval shape, a rounded rectangle, a stadium shape, and any other regular or irregular closed shape. The shape of a rectangle may make it convenient for allowing a stencil to fit neatly within its outline.

The second windows are arranged in rows 36 and columns 38. The columns of the second windows thus align with the columns of the second stencils, while the rows of the second windows are offset from the rows of the second stencils (in other words shifted above the rows of second stencils, as FIG. 2 reveals). In other implementations the relative arrangement could be different—for example the second windows could be shifted below the second stencils instead of shifted above the second stencils. Or, in other implementations, the rows of the second stencils and second windows could be aligned while their columns are misaligned—so that the second window columns are shifted to the right or to the left of the second stencil columns. Other configurations are possible. In any implementation in which the relative arrangement of second windows and second stencils is altered, corresponding alterations may also be made to the first marking mask (which first marking mask has been described above) as will be understood by the practitioner of ordinary skill in the art to form a desirable configuration for a wafer-scale marking system.

The first marking mask and second marking mask may be formed of any desirable materials, such as metals (silver, silicon, copper, chromium, aluminum, gold, titanium, and/or nickel as non-limiting examples), ceramic materials ($SiO_2$ and/or $Si_3N_4$ as non-limiting examples), polymers, composites, and the like. In the representative examples the first marking mask and second marking mask are formed of metals.

Figure 3:
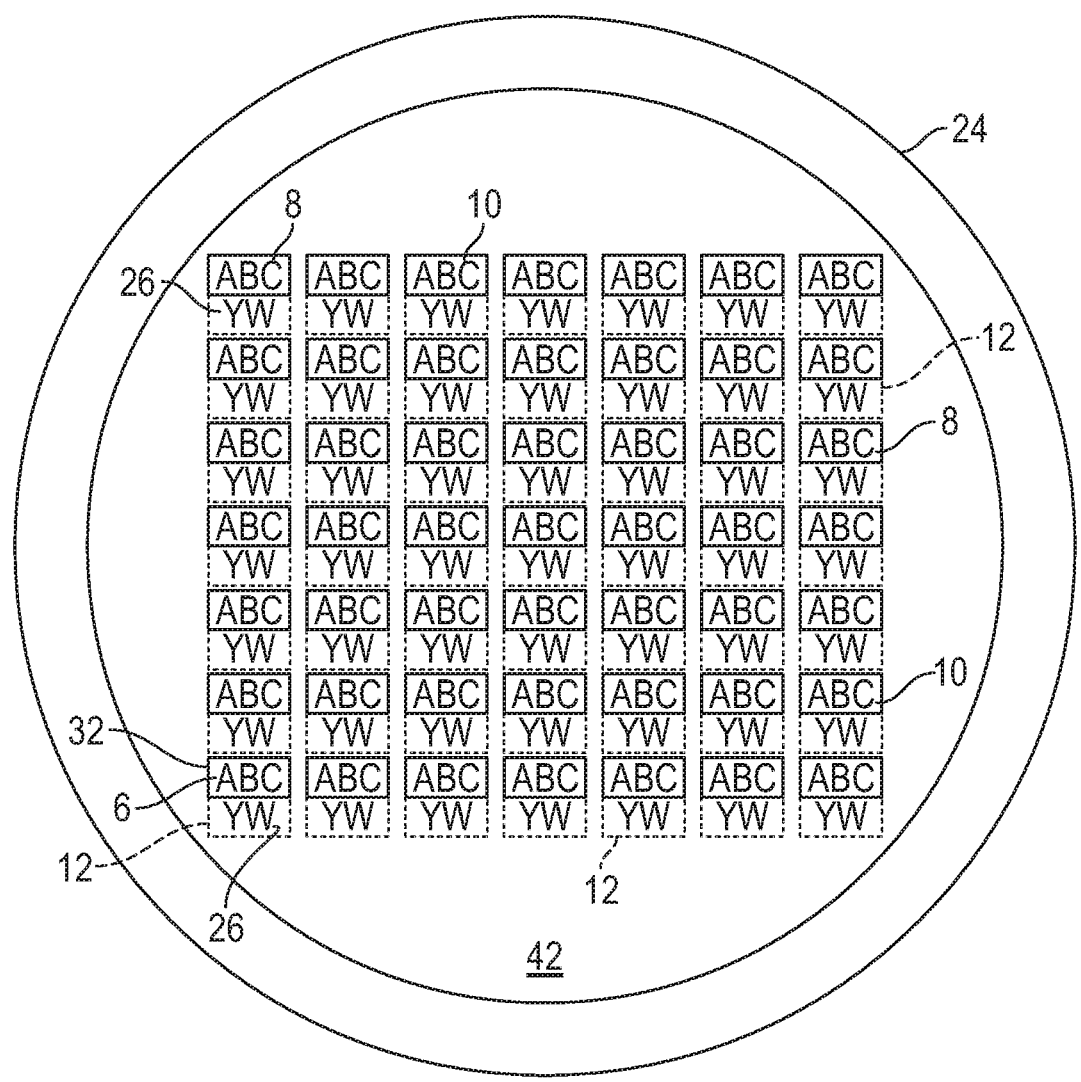
FIG. 3 is a top view of the first marking mask of FIG. 1 and second marking mask of FIG. 2 stacked atop one another.

Referring now to FIG. 3, the first marking mask and second marking mask may be stacked. In FIG. 3 the second marking mask 24 is stacked over the first marking mask, so that the second surface 42 of the second marking mask faces out of the page (and the second surface 22 of the first marking mask also faces out of the page but is covered by the second marking mask)—but in other implementations the first marking mask could be stacked over the second marking mask to achieve essentially the same overall stencil/window alignment. Other stacking arrangements could be used, with or without modifications to the first marking mask and second marking mask, as will be understood by the practitioner of ordinary skill in the art.

Because of the alignment of first stencils, second stencils, first windows, and second windows, when the first marking mask and second marking mask are stacked as shown in FIG. 3 the first windows align with the second stencils while the second windows align with the first stencils. In the configuration of FIG. 3 the first marking mask is below the second marking mask but portions of the first marking mask, including the first stencils 6, are visible through the second windows of the second marking mask. As indicated previously, the second windows in the implementation shown have a rectangular shape, and they are sized so that the entirety of each first stencil fits within the outline of one of the second windows.

The entirety of each second stencil likewise fits within the outline of one of the first windows. The first windows are drawn in dashed lines in FIG. 3 to represent their positions below the second marking mask since they are not actually visible through the second marking mask. Each first window is thus seen to outline one of the second stencils.

The stacking of the first marking mask and second marking mask forms a composite marking assembly which allows the simultaneous marking of a wafer with both the first stencils and second stencils. If the first marking mask were stacked above the second marking mask a similar composite marking assembly would be formed which likewise allows the simultaneous marking of a wafer with both the first stencils and second stencils.

A representative example of a simultaneous marking process using the stacked configuration of FIG. 3 is shown in FIG. 4. The wafer-scale marking system (system) 2 in the representative example of FIG. 4 includes a holder 44 having a base 46 with a first recess 48 configured to receive a semiconductor wafer (wafer) 60, the wafer including a plurality of unsingulated semiconductor devices and the wafer further having a first surface 62. The base has a second recess 50 for receiving the marking masks. The first marking mask is placed over the first surface of the wafer and the second marking mask is placed over the first marking mask, in the alignment shown in FIG. 3. In other implementations the order of the marking masks may be reversed, as has been described. A retainer 52 may be utilized to hold the marking masks snugly in place and in alignment. One or more of the holder, base, retainer, first recess, and second recess may have alignment aids (such as slots, protrusions, visual markings, etc.) to ensure that the wafer, first marking mask, and second marking mask are properly aligned for marking.

The system 2 in the implementation shown in FIG. 4 does not include the wafer or the plasma, but the other elements shown are part of the system. The wafer and plasma are simply shown for convenience in illustrating the method of use of the system. Other implementations of wafer-scale marking systems (systems) may include the wafer and/or the plasma and/or a plasma system. Implementations of wafer-scale marking systems may exclude one or more of the first recess, second recess, and/or retainer, but may instead have other configurations to ensure that the wafer, first marking mask, and second marking mask are in alignment for the marking process.

Once the wafer, first marking mask, and second marking mask are properly aligned, plasma 54 is used to plasma-etch the first surface of the wafer through the first marking mask and the second marking mask. The plasma of course etches the wafer by removing some of the silicon or other wafer material to form the marking characters or symbols. As can be seen in FIG. 4, each first stencil 6 is located within the outline of one of the second windows 32 so that the plasma may etch the first surface of the wafer through the second window and first stencil to form a marking in the first surface of the wafer corresponding with the first stencil shape. Likewise, each second stencil 26 is seen to be located within the outline of one of the first windows 12 so that the plasma may etch the first surface of the wafer through the second stencil and the first window to form a marking in the first surface of the wafer corresponding with the second stencil shape.

Any type of plasma or plasma system may be used for the plasma etching such as, by non-limiting example, one or more or any combination of the following: $NF_3$, $SF_6$, $CF_4$, $C_{12}$, $CCl_4$, HBr, $C_4F_8$, $C_4F_6$, $CHF_3$, $CH_2F_2$, $CH_3F$, $BCl_3$, $O_2$, $N_2$, and so forth. The plasma etching may or may not include ion bombardment (reactive ion etching or RIE), deep reactive ion etching (DRIE), inductively coupled plasma (ICP), and so forth.

The first marking mask, when it includes first stencils that are device codes, may be a device code mask. When the second marking mask includes second stencils that are date codes it may be a date code mask. Together a stacked device code mask and date code mask form a combined device and date code mask/assembly.

Although only two marking masks are shown stacked in the drawings, the practitioner of ordinary skill in the art will understand how the device elements and methods described herein may be expanded to be used with a greater number of stacked masks. By non-limiting example, three stackable marking masks could be used, each having stencils, and the stencils of each mask aligning with windows of both of the other masks so that the plasma etching process marks the first surface of a wafer using all three stencils. Using such an assembly/method a wafer could be simultaneously marked with a date code, a device code, and a manufacturing plant/site code, or some other combination of three markings. In a similar manner, four masks, five masks, six masks, and so forth, could be stacked to create any number of markings on a wafer by expanding upon the stencil and window concepts described herein.

Of course, in implementations, a single marking mask could be utilized which includes both the first stencils and the second stencils (and/or other stencils). In such a case the single marking mask could allow plasma etching to simultaneously form device codes and date codes, and/or other codes or markings, or the like, using a single mask. Using more than one mask, however, in implementations may allow for fewer overall masks (and thus lower costs) in a processing plant in which several types of devices are fabricated—because the same date code masks may be used regardless of the device type, and thus for instance it is possible that only one device type mask will be needed for each device type and that date code masks may be shared between/among device types.

From FIGS. 3 and 4 it may be seen that, during the marking process, the rows of the first stencils and the rows of the second windows align, the rows of the second stencils and the rows of the first windows align, and the columns of the first stencils, first windows, second stencils, and second windows align. During the marking process the first window rows and second window rows are offset, with the first window rows being below the second window rows. The first stencil rows and the second stencil rows are offset from one another, with the second stencil rows being below the first stencil rows. The first marking mask and second marking mask may be altered, however, and in such implementations these alignments and misalignments of rows and/or columns may accordingly be altered, while still achieving a desirable composite marking mask/assembly.

Figure 5:
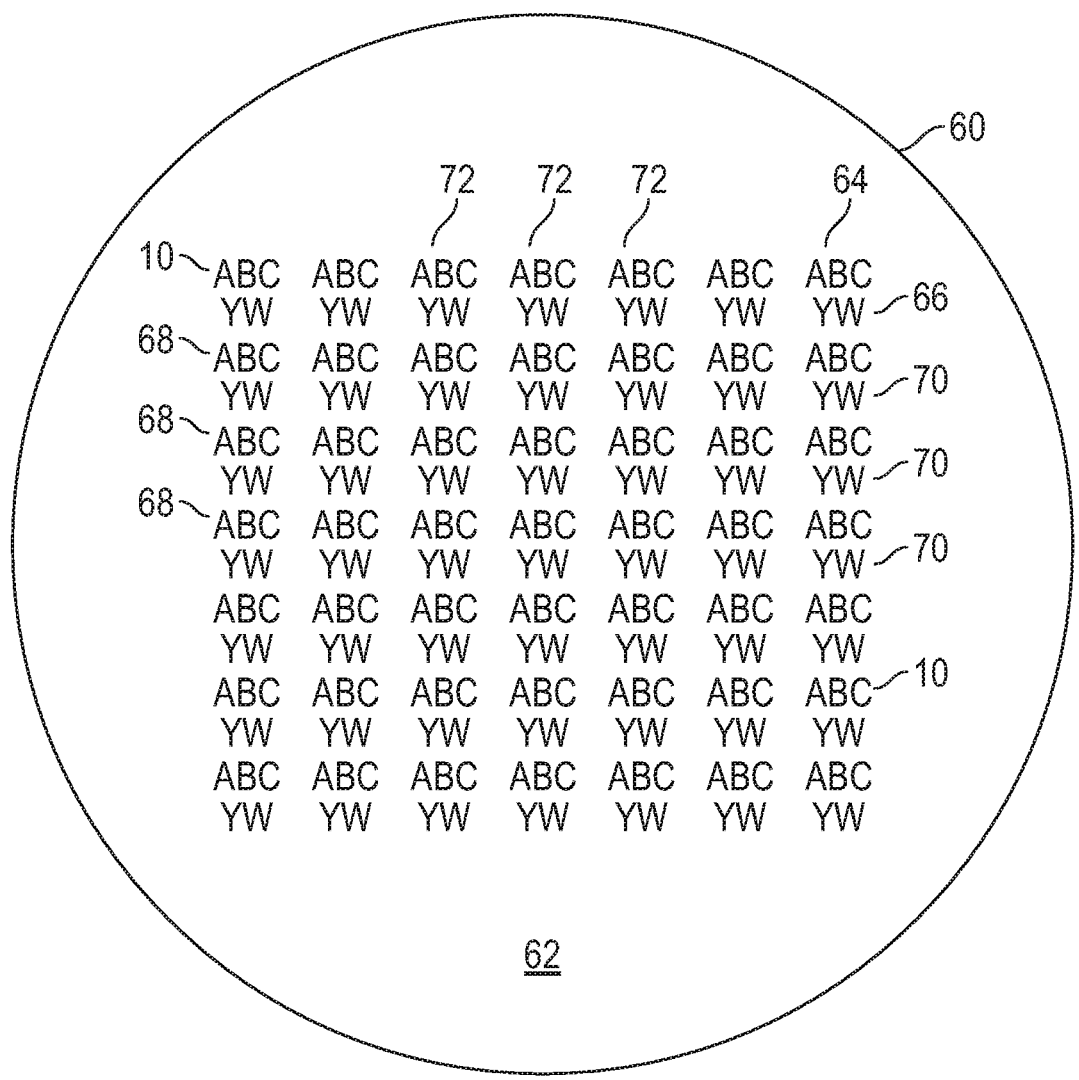
FIG. 5 is a top view of an implementation of a marked semiconductor wafer.

FIG. 5 shows the wafer 60, with the first surface 62 facing out of the page, after the marking procedure of FIG. 4 has been completed. The marking process leaves a plurality of first markings 64 (each labeled "ABC"), which correspond with the first stencils and which include the device code 10, aligned in rows 68 and columns 72. The marking process also leaves a plurality of second markings 66 (each labeled "YW"), which correspond with the second stencils and which include the date code 30, aligned in rows 70 and columns 72.

The marked wafer accordingly includes rows of first markings and rows of second markings that are misaligned, with the rows of second markings being below the rows of first markings—while the columns of the first markings and second markings are aligned. The first markings could be something other than device codes, and the second markings could be something other than date codes, as has been explained above. Likewise, the masks may be altered as described above to achieve a different marked configuration, such as with the second marking rows being above the first marking rows, or the first marking rows and second marking rows being aligned but the first marking columns and the second marking columns being offset, with either to one side of the other, and so forth.

The use of plasma etching together with the first marking mask and second marking mask allows for simultaneous formation of the first markings and second markings. More specifically, the system and methods described herein allow all of the first markings to be formed simultaneously, all of the second markings to be formed simultaneously, and all of the first markings and all of the second markings to be formed simultaneously.

Such a simultaneous marking process may reduce an amount of time required to mark a wafer. Because all of the characters are marked simultaneously, regardless of whether the wafer is a six-inch wafer or an eight-inch wafer (or any other size) in implementations it may take only, or about only, five minutes to mark all the characters (date codes, device codes, traceability codes, etc.) on the wafer. This time estimate does not include loading and unloading of the wafer into and out of the marking system. Nevertheless, the marking time using the systems and methods described herein is not dependent on the number of characters or symbols to be marked, the size of the characters or symbols to be marked, the number of devices to be marked, or the size of the wafers.

Marking processes using plasma etching and marking masks as described herein may further allow for very small characters, which may allow the marking of very small devices and/or may allow for more characters to be marked on devices than is conventionally possible. For example, plasma etching may allow characters (such as the alphanumeric characters shown in the drawings) having an overall height of only, or only about, four thousandths of an inch (4 mils). In implementations such small characters will allow a 0.4 mm by 0.2 mm device (i.e., a device having a marking area of only 0.2 mm by 0.4 mm) to be marked with two alphanumeric characters such as those shown in the drawings.

The marked wafer shown in FIG. 5 does not include any scribe lines to be used for singulation. In conventional processes after a wafer is marked (which conventionally has been done with laser marking) the wafer would be flipped, contact side up (i.e., second surface 63, with contact pads, facing up) so that a saw/singulation tape may be adhered to the wafer. After singulation each device would then be flipped again for placement on a carrier tape and reel for shipment to a customer, such as for pick-and-place installation processes. In such conventional processes the semiconductor devices are thus flipped twice after marking for singulation and then placement device by device on a tape and reel.

In implementations scribe lines defining or indicating saw streets may be formed on first surface 62 of the wafer, using processes similar to those described above for etching characters/symbols, so that the wafer/devices do not need to be flipped for sawing and later tape and reel placement. Etching scribe lines in the first surface 62 allows the wafer to be sawn contact side down (i.e., second surface 63 down) and eliminates both of the above mentioned flipping steps. Thus the wafer may be singulated without being flipped, and after singulation each device may be picked up and placed directly down on a tape and reel without being flipped. In implementations this may reduce process time, reduce equipment expenses, and reduce defects (as tape and reel defects may be introduced during flipping processes).

Figure 6:
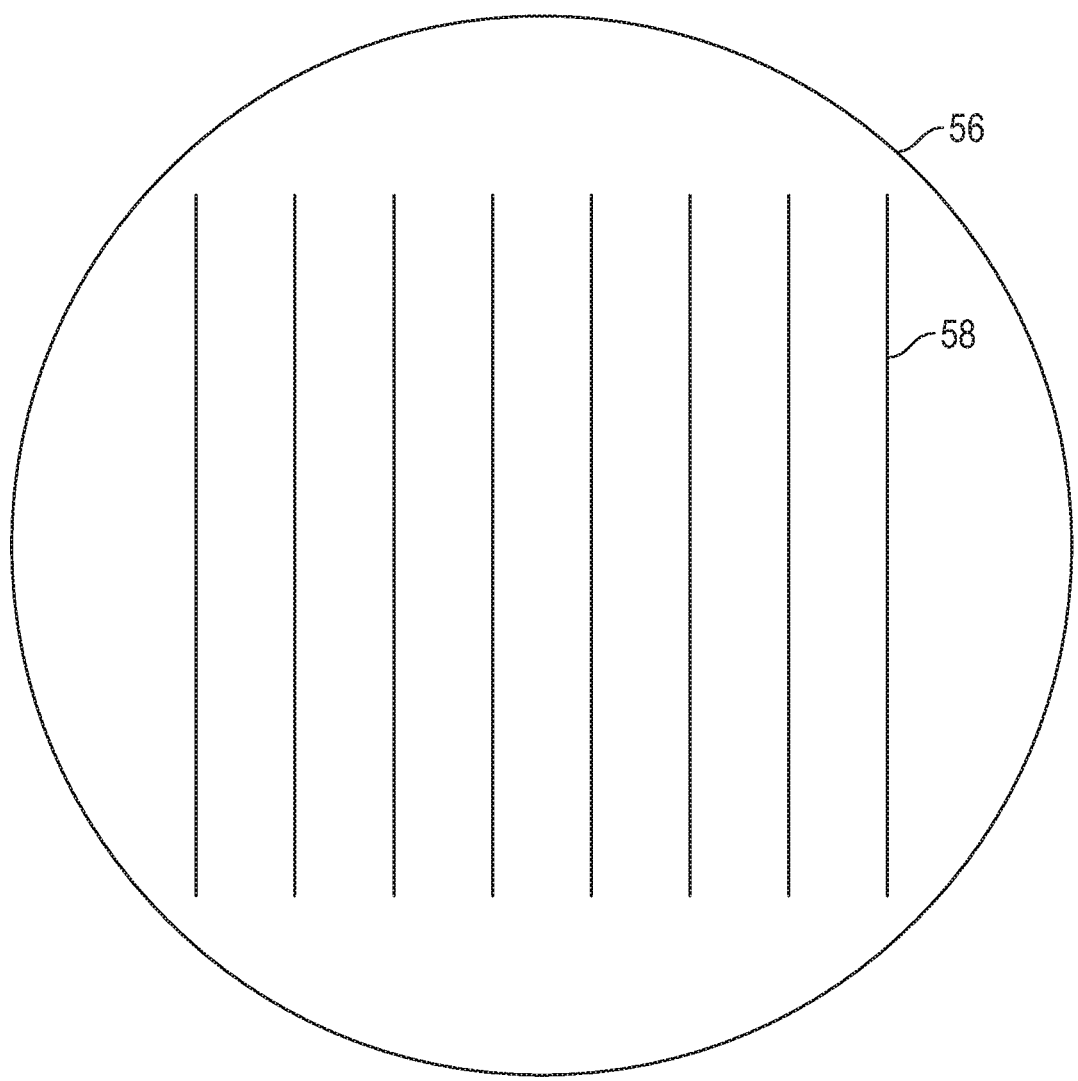
FIG. 6 is a top view of an implementation of a third marking mask of the system of FIG. 4.

There are a number of ways in which scribe lines may be etched in the first surface 62 of a wafer (such as a flip chip or CSP wafer) for the purpose of providing a sawing or scribe grid. A few representative examples will be given herein. Referring to FIG. 6, a third marking mask 56 is shown having a plurality of scribe line stencils 58 therein. Each scribe line stencil extends all the way through the third marking mask from a first surface of the third marking mask (facing out of the page in FIG. 6) to a second surface of the third marking mask (facing into the page in FIG. 6). Before or after the device/date/traceability and/or other marking of the wafer as described above is completed, the third marking mask may be placed over the wafer without the first marking mask and without the second marking mask present, and a plasma etch process may be used to etch scribe lines in one direction. The plasma etch process may be paused/stopped the third marking mask rotated 90 degrees, and the plasma etch process resumed/started over to etch scribe lines in the transverse direction. In this way scribe lines may be formed between the above described rows and columns of the first markings and second markings (and correspondingly between rows and columns of the unsingulated devices).

Figure 7:
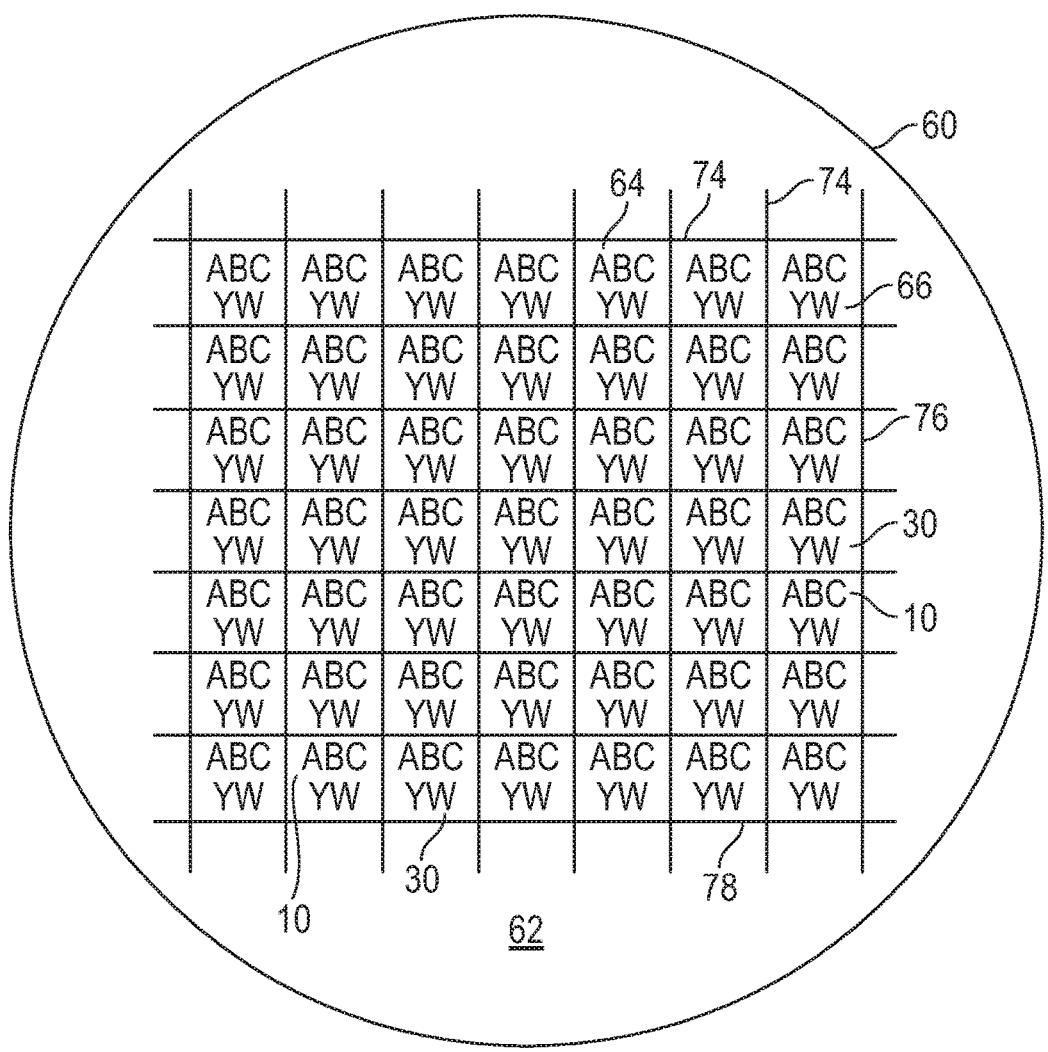
FIG. 7 is a top view of another implementation of a marked semiconductor wafer.

FIG. 7 shows a representative example of a marked wafer that has scribe lines 74 therein. These could be formed using the method described above, wherein a separate third marking mask is used at a first rotation, and then at a second rotation, to create vertical scribe lines (column scribe lines)

76 and horizontal scribe lines (row scribe lines) 78. Whether the third marking mask is used for this process before or after the first markings and second markings are made with the first marking mask and second marking mask, respectively, the outcome will be the same configuration, i.e., that shown in FIG. 7.

In some cases, however, the process may be further quickened using one or more other techniques. For example, scribe line stencils such as those shown in the third marking mask may also be included in each of the first marking mask and the second marking mask (and/or other marking masks if more than two character/symbol marking masks are used). By non-limiting example, the scribe line stencils of the character/symbol marking masks may be oriented in the same direction and may align so that, when the character etching is being performed, scribe lines in one direction (horizontal or vertical) are also being etched. The character/symbol marking masks may then be removed and the third marking mask placed over the wafer so that its scribe line stencils are transverse to the scribe lines already formed in the wafer, and thus through a first plasma etching process the characters and some of the scribe lines (vertical or horizontal) may be simultaneously formed, and then through a second plasma etching process the remaining scribe lines (horizontal or vertical) are formed.

Naturally, this process may be altered in a variety of ways. For example, if the first marking mask and second marking mask each have vertical scribe line stencils, they would be used to form the vertical scribe lines while the third marking mask would be used, either before or after the use of the first marking mask and second marking mask, to form the horizontal scribe lines. If the first marking mask and second marking mask each have horizontal scribe lines stencils, they would be used to form the horizontal scribe lines while the third marking mask would be used, either before or after the use of the first marking mask and second marking mask, to form the vertical scribe lines. The practitioner of ordinary skill in the art will understand the orientation processes needed to ensure that the horizontal and vertical scribe lines are formed at correct angles relative to one another by proper positioning of the various marking masks during plasma etch processes. The creation of either vertical or horizontal scribe lines using scribe line stencils in the first marking mask and second marking mask of course implies that the scribe line stencils of the first marking mask are aligned with the scribe line stencils of the second marking mask so that the plasma passes through the scribe line stencils of each character/symbol marking mask to form the scribe lines.

The above processes describe methods in which half of the scribe lines (i.e., vertical or horizontal) are formed simultaneous with the formation of the characters and/or symbols previously described, and another half of the scribe lines (i.e., horizontal or vertical) are formed at a different time, either earlier or later, using a separate third marking mask. In implementations it is possible that use of the third marking mask could be obviated altogether, and instead dashed scribe lines in both directions (horizontal and vertical) could be formed in the wafer using aligned dashed scribe line stencils in both the first marking mask and second marking mask (and in any other character or symbol marking mask that is similarly stacked for the plasma etching process). This, of course, would require the scribe line stencils of each marking mask, both horizontal and vertical scribe line stencils, to be dashed, so that each marking mask is still a unitary structure/network having stencils and windows in appropriate places and rigid enough to be used for the marking processes described herein.

The use of dashed scribe line stencils will result in dashed scribe lines. One advantage of using this process is that it may reduce processing time by eliminating the need to use the third marking mask for a separate plasma etching step to form scribe lines. One advantage of utilizing the third marking mask, however, is the ability to form scribe lines that are not dashed, but instead are continuous, which may result in fewer defects in the devices and/or a cleaner or more accurate sawing/singulation process with less chance of chipping and the like due to the scribe lines being continuous.

In various implementations, the scribe line stencils may also include alignment features for saw or other singulation process tools to use to align the wafer during the singulation process. These alignment features/patterns may be placed in locations corresponding with the corners of the devices or along the side(s) of the devices. Not every die may need an alignment feature, so the alignment features may be present only on a subset of the devices.

Although saw singulation is described above, other forms of singulation may be implemented to singulate the semiconductor devices of the wafer, such as plasma etch singulation, and in such cases scribe lines as described above may or may not be used.

In implementations, as has been discussed to some extent above, all of the device marking is done using plasma etching, so that no laser marking is utilized to form any markings on the semiconductor devices, and/or so that no laser marking is utilized to form any markings on the first surface 62 of the wafer.

In places where the description above refers to particular implementations of wafer-scale marking systems and related methods and implementing components, sub-components, methods and sub-methods, it should be readily apparent that a number of modifications may be made without departing from the spirit thereof and that these implementations, implementing components, sub-components, methods and sub-methods may be applied to other wafer-scale marking systems and related methods.

What is claimed is:

1. A method of wafer-scale marking, comprising:
providing a semiconductor wafer comprising a plurality of unsingulated semiconductor devices, the semiconductor wafer having a surface;
coupling a first marking mask over the surface, the first marking mask comprising a plurality of first stencils therethrough;
plasma etching the surface through the plurality of first stencils to form a plurality of first markings in the surface;
coupling a second marking mask over the surface, the second marking mask comprising a plurality of second stencils therethrough, and;
plasma etching the surface through the plurality of second stencils to form a plurality of second markings in the surface.

2. The method of claim 1, further comprising simultaneously coupling the first marking mask and the second marking mask over the surface.

3. The method of claim 1, further comprising simultaneously forming each of the plurality of first markings.

4. The method of claim 3, further comprising simultaneously forming each of the plurality of second markings while simultaneously forming each of the plurality of first markings.

5. The method of claim 1, further comprising simultaneously forming each of the plurality of second markings.

6. The method of claim 1, further comprising aligning a plurality of first windows of the first marking mask with the plurality of second stencils while simultaneously aligning a plurality of second windows of the second marking mask with the plurality of first stencils.

7. The method of claim 1, further comprising plasma etching a plurality of scribe lines in the surface through a plurality of scribe line stencils in one of the first marking mask, the second marking mask, and a third marking mask.

8. The method of claim 1, wherein each of the plurality of first markings comprises one of a semiconductor device identifier and a date indicator.

9. The method of claim 1, wherein each of the plurality of second markings comprises one of a semiconductor device identifier and a date indicator.

10. The method of claim 1, wherein one of the plurality of first markings and the plurality of second markings comprises alphanumeric characters.

11. A method of wafer-scale marking, comprising:
providing a semiconductor wafer comprising a plurality of unsingulated semiconductor devices, the semiconductor wafer having a surface;
coupling a first marking mask over the surface, the first marking mask comprising a plurality of first stencils therethrough and comprising a plurality of first windows therethrough;
coupling a second marking mask over the surface so that a plurality of second stencils of the second marking mask align with the plurality of first windows and so that a plurality of second windows of the second marking mask align with the plurality of first stencils, the plurality of second stencils and the plurality of second windows extending through the second marking mask;
forming a plurality of first markings on the surface by plasma etching the surface through the plurality of second windows and through the plurality of first stencils, and;
while forming the plurality of first markings, simultaneously forming a plurality of second markings on the surface by plasma etching the surface through the plurality of first windows and through the plurality of second stencils.

12. The method of claim 11, wherein the plurality of first windows are aligned in rows and columns that align with rows and columns of the plurality of second stencils.

13. The method of claim 11, wherein the plurality of second windows are aligned in rows and columns that align with rows and columns of the plurality of first stencils.

14. The method of claim 11, further comprising plasma etching a plurality of scribe lines in the surface through a plurality of scribe line stencils in one of the first marking mask, the second marking mask, and a third marking mask.

15. The method of claim 11, wherein each of the plurality of first markings and each of the plurality of second markings comprises one of a semiconductor device identifier and a date indicator, and wherein one of the plurality of first markings and the plurality of second markings comprises alphanumeric characters.

16. A wafer-scale marking system (system), comprising:
a holder configured to receive a semiconductor wafer;
a first marking mask configured to couple with the holder over the semiconductor wafer, the first marking mask comprising a plurality of first stencils therethrough and a plurality of first windows therethrough, the plurality of first stencils aligned in rows and columns and the plurality of first windows aligned in rows and columns, and;
a second marking mask configured to couple with the holder over the first marking mask, the second marking mask comprising a plurality of second stencils therethrough and a plurality of second windows therethrough, the plurality of second stencils aligned in rows and columns and the plurality of second windows aligned in rows and columns;
wherein the plurality of first stencils align with the plurality of second windows and wherein the plurality of second stencils align with the plurality of first windows.

17. The system of claim 16, wherein the system is configured to allow plasma etching of a surface of the semiconductor wafer through the plurality of first stencils and the plurality of second windows to form a plurality of first markings while simultaneously allowing plasma etching of the surface through the plurality of second stencils and the plurality of first windows to form a plurality of second markings.

18. The system of claim 16, wherein each of the plurality of first stencils and each of the plurality of second stencils comprises one of a semiconductor device identifier and a date indicator, and wherein one of the plurality of first stencils and the plurality of second stencils comprises alphanumeric characters.

19. The system of claim 16, wherein the columns of the plurality of first stencils, the columns of the plurality of first windows, the columns of the plurality of second stencils, and the columns of the plurality of second windows are aligned, wherein the rows of the plurality of first stencils and the rows of the plurality of first windows are offset, and wherein the rows of the plurality of second stencils and the rows of the plurality of second windows are offset.

20. The system of claim 16, wherein the rows of the plurality of first stencils and the rows of the plurality of second windows are aligned, and wherein the rows of the plurality of second stencils and the rows of the plurality of first windows are aligned.

* * * * *